(12) United States Patent
Minagawa et al.

(10) Patent No.: US 6,508,854 B2
(45) Date of Patent: Jan. 21, 2003

(54) METHOD OF PREPARING MAGNETOSTRICTIVE MATERIAL IN MICROGRAVITY ENVIRONMENT

(75) Inventors: Hideki Minagawa, Kitahiroshima (JP); Takeshi Okutani, Sapporo (JP); Hideaki Nagai, Sapporo (JP); Takashi Tsurue, Sapporo (JP); Yoshinori Nakata, Sapporo (JP); Keiji Kamada, Sapporo (JP)

(73) Assignee: National Institute of Advanced Industrial Science and Technology (JP)

( * ) Notice: Subject to any disclaimer, the term of this patent is extended or adjusted under 35 U.S.C. 154(b) by 0 days.

(21) Appl. No.: 09/740,810

(22) Filed: Dec. 21, 2000

(65) Prior Publication Data

US 2002/0029823 A1 Mar. 14, 2002

(30) Foreign Application Priority Data

Sep. 12, 2000 (JP) .................................... 2000-276045

(51) Int. Cl.$^7$ ............................................... C22C 1/02
(52) U.S. Cl. .................................. 75/10.67; 420/590
(58) Field of Search ......................... 75/10.67; 420/590

(56) References Cited

U.S. PATENT DOCUMENTS

| 4,308,474 A | | 12/1981 | Savage et al. ................ 310/26 |
| 4,615,760 A | * | 10/1986 | Dressler ...................... 117/221 |
| 4,695,427 A | * | 9/1987 | Degawa et al. ............. 266/280 |
| 4,818,304 A | | 4/1989 | Verhoeven et al. ......... 148/103 |
| 6,235,109 B1 | * | 5/2001 | Okutani et al. .............. 117/12 |

OTHER PUBLICATIONS

CRC Handbook 79$^{th}$ edition. 1998 p. 12–115.*
Patent Abstracts of Japan, Vo. 1995, No. 8, Sep. 29, 1995.
"Translating Furnace for Fast Melting and Freezing", NTIS Tech Notes, Apr. 1, 1989.

* cited by examiner

Primary Examiner—Roy King
Assistant Examiner—Tima McGuthry-Banks
(74) Attorney, Agent, or Firm—Lorusso & Loud

(57) ABSTRACT

A method of preparing a magnetostrictive material, including the steps of:
(a) forming a melt of metals having a composition corresponding to the magnetostrictive material;
(b) subjecting the melt to a micro-gravity environment; and
(c) cooling the melt in the micro-gravity environment at a rate of at least 50° C. per second, while applying a magnetic field to the melt, to solidity the melt.

5 Claims, 1 Drawing Sheet

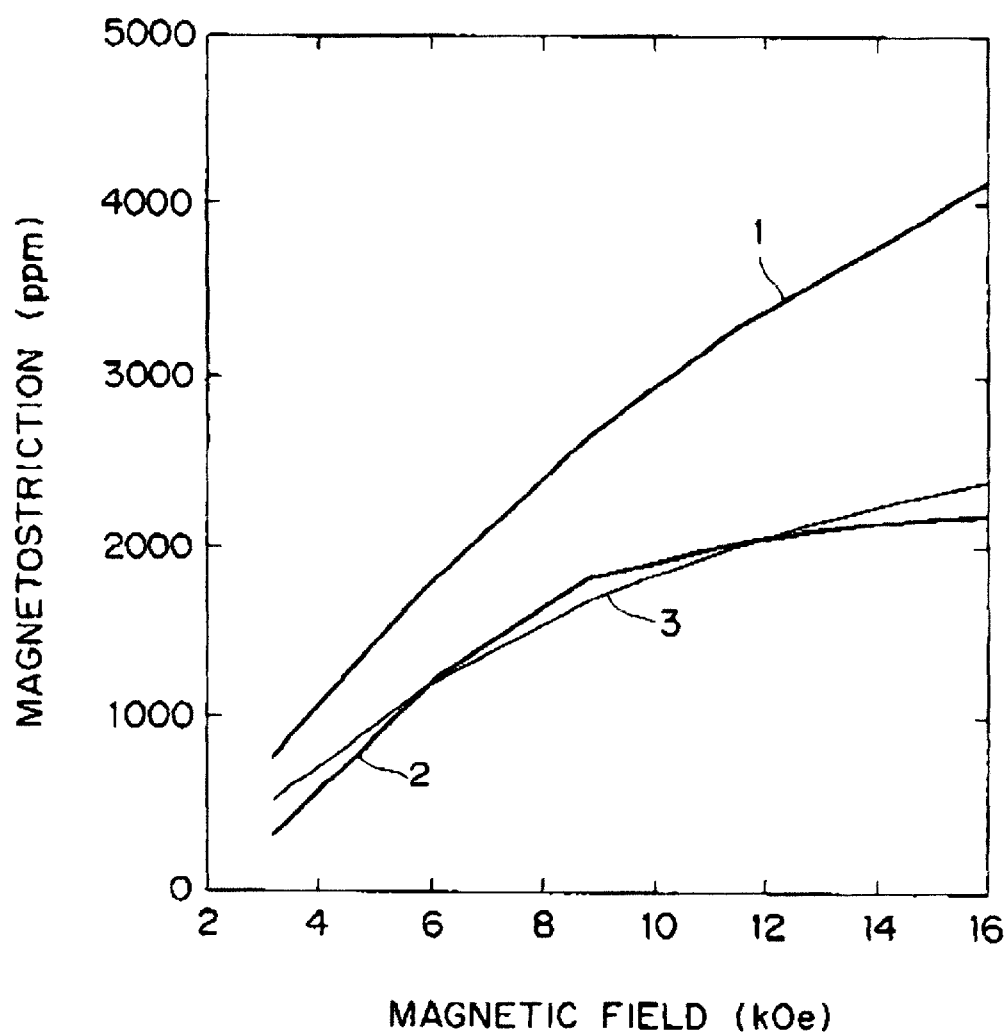
F I G.1

METHOD OF PREPARING MAGNETOSTRICTIVE MATERIAL IN MICROGRAVITY ENVIRONMENT

BACKGROUND OF THE INVENTION

This invention relates to a method of preparing a magnetostrictive material using a micro-gravity environment.

Magnetostriction is the property of a body of material to change the shape thereof when the state of magnetization thereof is changed. Magnetostriction of a transition metal material containing a rare earth element is about 100 times as great as the corresponding material containing no rare earth element. Such a magnetostrictive material having a high magnetostriction is generally called super-magnetostrictive material and may be utilized for many applications, for example, actuators, pressure sensors, ultrasonic generation devices.

The Czochralski (Cz) method and the floating zone (Fz) method have been proposed for the fabrication of a magnetostrictive material. Since these methods are ill-suited for the production of a high performance magnetostrictive material, however, the recent trend is toward the use of film forming techniques such as sputtering and vacuum deposition.

BRIEF SUMMARY OF THE INVENTION

In accordance with the present invention there is provided a method of preparing a magnetostrictive material, comprising the steps of:

(a) forming a melt of metals having a composition corresponding to the magnetostrictive material;

(b) subjecting said melt to a micro-gravity environment; and (c) cooling said melt in the micro-gravity environment at a rate of at least 50° C. per second, while applying a magnetic field to said melt, to solidify said melt.

It is an object of the present invention to provide a method of preparing a magnetostrictive material within a short period of time and at low costs.

Another method of the present invention is to provide a method which can produce high performance super-magnetostrictive material.

BRIEF DESCRIPTION OF THE DRAWING

Other objects, features and advantages of the present invention will become apparent from the detailed description of the preferred embodiments of the invention which follows, when considered in light of the accompanying drawing in which:

FIG. 1 is a graph showing magnetostrictive characteristics of a magnetostrictive material according to the present invention and comparative samples.

DETAILED DESCRIPTION OF THE PREFERRED EMBODIMENTS OF THE INVENTION

In a method of preparing a magnetostrictive material according to the present invention, a melt of metals having a composition corresponding to the magnetostrictive material is first prepared. A melt of a magnetostrictive alloy or a melt of metals having the same composition as that of the alloy may be used for the purpose of the present invention. The alloy may be any known magnetostrictive alloy such as an RN-based alloy wherein R is at least one rare earth element and M is at least one metal selected from the group consisting of transition metals and aluminum. Specific examples of the alloy include a FeTb alloy (e.g. an alloy having a composition of 33.3% of Tb and 66.7% of Fe based on total number of atoms), a FeDy alloy (e.g. an alloy having a composition of 33.3% of Dy and 66.7% of Fe based on total number of atoms) and a TbDyFe alloy (e.g. an alloy having a composition of 26.6% of Tb, 6.7% of Dy and 66.7% of Fe based on total number of atoms).

The melt is rapidly cooled at a rate of at least 50° C. per second under a micro-gravity environment while applying a magnetic field to the melt to solidify the melt and to obtain a magnetostrictive material. Thus, the melt is subjected to a micro-gravity environment and is rapidly cooled in an applied magnetic field. The formation and cooling of the melt may be carried out under vacuum or at an ambient pressure. A pressurized condition may also be used, if desired. An inert gas atmosphere may be suitably adopted, if necessary.

The micro-gravity environment may be created by free falling the melt. In a ballistic flight of an airplane or in a space shuttle, the micro-gravity environment can be also created. Generally, the melt is placed in a micro-gravity environment for about I second or more.

It is important that the melt should be cooled rapidly at a rate of at least 50° C. per second, preferably at least 100° C. per second, more preferably at least 150° C. per second. There is no specific upper limit of the cooling rate. Generally, however, the cooling rate is about 350° C. or less. Unidirectional cooling is desired. That is, it is desirable that the melt be cooled such that the solidification starts at one portion or area thereof and propagates, preferably at a rate of 1–10 mm per second, throughout the melt to prevent generation of a stress by expansion or shrinkage during the cooling. Such a stress might cause a defect of the magnetostrictive material. Thus, it is better not to start the solidification from two or more spaced apart portions of the melt.

In one preferred embodiment, the cooling of the melt is carried out by contacting the melt with a solid surface having a temperature lower by at least 1,000° C., more preferably at least 1,300–1500° C., than that of the melt.

The solid is preferably a magnet providing a magnetic flux density of at least 0.01 T (tesla) at the surface, more preferably 0.03–1 T. The magnet may be an electromagnet or a permanent magnet. A ferromagnetic material such as Fe, Ni or an alloy thereof may be suitably used for the magnet.

In one preferred embodiment, a melt is allowed to free fall and is brought into impingement against a stationary magnet surface so that the melt in the micro-gravity environment is cooled in an applied magnetic field and solidified to form a magnetostrictive material.

In another preferred embodiment, a free falling capsule is used. A table for supporting a melt and an iron block having a cooling surface are disposed in the capsule. The iron block is provided with a coil to create magnetic field upon being electrically energized. By relatively moving the iron block toward the table during the free fall of the capsule, the sample on the table, when contacted with the magnet surface, is cooled in an applied magnetic field and solidified to form a magnetostrictive material.

The following examples will further illustrate the present invention.

Example 1

A drop tower of a stainless steel pipe was used for forming a micro-gravity environment. A gravity of $10^{-3}$g can be established for 1.2 seconds with this tower. An iron block having a coil was disposed in a capsule. The iron block had a contacting surface maintained at 100° C. and was adapted to provide a magnetic flux density of 0.04 T at the surface thereof when the coil was electrically connected to a power source. A sample table was disposed adjacent to the contacting surface of the iron block for supporting a melt thereon. The table was provided with a heater so that a raw material placed thereon was able to be heated and melted. The iron block was connected to a drive motor through a gear mechanism for relative movement against the table. An argon gas was introduced into the capsule at a rate of 30 sccm (0.05 Pam$^3$/sec) so that the capsule was maintained at 0.15 MPa (about 1.5 atm).

A disk (diameter: 10 mm, thickness of 3 mm) of a TbFe$_2$ alloy was placed on the table and heated to 1350° C. through 40 seconds to form a melt. When the temperature of 1350° C. was reached, the capsule was started free falling. After about 0.2 second from the start of the free fall, the heater was switched OFF with the simultaneous actuation of the motor and the coil so that the melt was contacted with the cooling surface of the iron block while being subjected to the magnetic field. The capsule free fell for about 1 second, through which the melt was cooled to 1,100° C. and solidified.

Example 2

A drop tower of a 490 m tall adapted to form a microgravity environment of 10$^{-4}$ g for 10 seconds was used through which a capsule accommodating a movable electromagnet and a heater table free fell.

A disk (diameter: 10 mm, thickness of 3 mm) of a TbFe$_2$ alloy was placed on the table and heated to 1350° C. through 40 seconds to form a melt. When the temperature of 1350° C. was reached, the capsule was started free falling. After about 2 seconds from the start of the free fall, the heater was switched OFF with the simultaneous actuation and displacement of the electromagnet so that the melt was contacted with a cooling surface of the electromagnet while being subjected to a magnetic field. The capsule free fell for about 8 seconds, through which the melt was cooled to 800° C. and solidified.

Comparative Example 1

A disk of a TbFe$_2$ alloy as used in Example 1 was heated to 1350° C. through 40 seconds to form a melt. The melt was then contacted with a surface of a non-magnetic solid and cooled to 1,100° C. through about 1 second.

Comparative Example 2

Comparative Example 1 was repeated in the same manner as described except that an electromagnet providing a magnetic flux density of 0.04 T was substituted for the non-magnetic solid.

Each of the thus treated alloy obtained in Example 1 and Comparative Examples 1 and 2 was measured for the magnetostrictive characteristics thereof. The results are shown in FIG. 1 showing dependence of the magnetostriction $\lambda (=2(|\Delta L_\parallel| + |\Delta L_\perp|)/3L$ where L is a length of a sample, and $\Delta L_\parallel$ and $\Delta L_\perp$ are amounts of elongation or contraction, caused by application of magnetic filed, of the sample along the directions parallel with and normal to the magnetic field, respectively) of test samples upon the applied magnetic field.

As will be appreciated from the results shown in FIG. 1, the alloys of Comparative Examples 1 and 2 which are solidified in normal gravity environment with and without applied magnetic field exhibit similar magnetostrictive characteristics (curves 2 and 3). In contrast, the alloy obtained by the method according to the present invention exhibits more than 1.5 times as high magnetostriction (curve 1) as that of the comparative samples. Moreover, the magnetostriction does not saturate even at 16 kOe in the case of the magnetostrictive alloy of the present invention (curve 1), whereas an increase of the magnetostriction of the comparative alloys becomes very small at 10 kOe or more.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method of preparing a magnetostrictive material, comprising the steps of:

(a) melting metals having a composition corresponding to the magnetostrictive material;

(b) subjecting said melt to a micro-gravity environment;

(c) cooling said melt in the micro-gravity environment at a rate of at least 50° C. per second, by contacting said melt with a surface of a magnet having a temperature lower by at least 1,000° C. than that of said melt to solidify said melt; and (d) while cooling said melt in the micro-gravity environment, applying to said melt a magnetic field with a magnetic flux density of at least 0.01 T at said surface.

2. A method as claimed in claim 1, wherein said melt is composed of metals of an RM-based alloy wherein R is at least one rare earth element and M is at least one metal selected from the group consisting of transition metals and aluminum.

3. A method as claimed in claim 2, wherein said alloy is selected from the group consisting of a FeTb alloy, a FeDy alloy and a TbDyFe alloy.

4. A method as claimed in claim 1, wherein step (c) is so performed that said cooling starts at one portion of the melt.

5. A method as claimed in claim 1 wherein step (b) comprises permitting said melt to free fall.

* * * * *

UNITED STATES PATENT AND TRADEMARK OFFICE
CERTIFICATE OF CORRECTION

PATENT NO. : 6,508,854 B2
DATED : January 21, 2003
INVENTOR(S) : Minagawa et al.

It is certified that error appears in the above-identified patent and that said Letters Patent is hereby corrected as shown below:

<u>Title page,</u>
Item [57], ABSTRACT,
Line 9, "solidity" should read -- solidify --.

<u>Column 4,</u>
Line 3, "$\triangle L/8$" should read -- $\triangle L//$ --; and
Line 4, "filed" should read -- field --.

Signed and Sealed this

Twenty-seventh Day of May, 2003

JAMES E. ROGAN
*Director of the United States Patent and Trademark Office*